(12) United States Patent
Strom et al.

(10) Patent No.: US 10,361,707 B2
(45) Date of Patent: Jul. 23, 2019

(54) EFFICIENT DIFFERENTIAL CHARGE PUMP WITH SENSE AND COMMON MODE CONTROL

(71) Applicant: International Business Machines Corporation, Armonk, NY (US)

(72) Inventors: James D. Strom, Rochester, MN (US); Grant P. Kesselring, Rochester, MN (US); Ann Chen Wu, Hopewell Junction, NY (US); Scott R. Trcka, Rochester, MN (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 15/825,903

(22) Filed: Nov. 29, 2017

(65) Prior Publication Data

US 2019/0165795 A1    May 30, 2019

(51) Int. Cl.
*H03L 7/06* (2006.01)
*H03K 5/02* (2006.01)
(Continued)

(52) U.S. Cl.
CPC ............ *H03L 7/0896* (2013.01); *H03L 7/093* (2013.01)

(58) Field of Classification Search
CPC ......... H03L 7/0896; H03L 7/093; H03L 7/06; H02M 3/158
(Continued)

(56) References Cited

U.S. PATENT DOCUMENTS 6,075,406 A    6/2000   Lee et al.
6,124,751 A *  9/2000   Pidutti ................... G11B 5/022
                                                    327/110
(Continued)

FOREIGN PATENT DOCUMENTS

CN    102882369 A    1/2013
EP    1469574 A1    10/2004

OTHER PUBLICATIONS

Shin et al., "Low-Common Mode Voltage H-Bridge Converter with Additional Switch Legs", IEEE (see pp. 1773, 1778). http://ieeexplore.ieee.org/stamp/stamp.jsp?arnumber=6287598.
(Continued)

*Primary Examiner* — Brandon S Cole
(74) *Attorney, Agent, or Firm* — Patterson + Sheridan, LLP

(57) ABSTRACT

A system and apparatus relating to a differential charge pump circuit for use in a phase-locked loop (PLL) circuit. A differential charge pump circuit can include a reference current, two sense amplifiers, a common mode control amplifier, and an h-bridge circuit. The h-bridge circuit is coupled to the reference current and the common mode control amplifier. The reference current drives a first portion of the h-bridge circuit and the common mode control amplifier controls a second portion of the h-bridge circuit. The h-bridge circuit also includes first and second nodes. The nodes are inputs to one of the sense amplifiers. The differential charge pump circuit is configured to control a voltage at the first node so that it is substantially equal to a voltage at the second node for a plurality of voltages at the second node. The differential charge pump circuit can also include a transistor with a gate coupled to an output of a sense amplifier. The voltage at the first node can be controlled by the sense amplifier and the transistor.

24 Claims, 6 Drawing Sheets

(51) Int. Cl.
    *H02M 3/158* (2006.01)
    *G11B 5/09* (2006.01)
    *A61M 16/00* (2006.01)
    *H03L 7/089* (2006.01)
    *H03L 7/093* (2006.01)

(58) Field of Classification Search
    USPC .............. 327/2–12, 105–123, 141, 144–163;
    331/15–17; 375/373–376
    See application file for complete search history.

(56) References Cited

U.S. PATENT DOCUMENTS

| | | | |
|---|---|---|---|
| 6,255,873 | B1 | 7/2001 | Johnson et al. |
| 7,236,003 | B2 | 6/2007 | Chellamuthu et al. |
| 7,872,433 | B2 | 1/2011 | Nuebling et al. |
| 7,952,424 | B2 | 5/2011 | Sanduleanu et al. |
| 8,581,646 | B2 | 11/2013 | Fan |
| 8,917,126 | B1 * | 12/2014 | Ficke .................... G06F 1/3237 |
| | | | 327/157 |
| 2008/0029096 | A1 * | 2/2008 | Kollmeyer ........ A61M 16/0057 |
| | | | 128/204.21 |
| 2011/0199152 | A1 | 8/2011 | Swei et al. |
| 2011/0298509 | A1 * | 12/2011 | Khoury ................. H03L 7/0818 |
| | | | 327/158 |
| 2014/0084883 | A1 * | 3/2014 | Tanabe ................ H02M 3/1582 |
| | | | 323/271 |
| 2015/0381039 | A1 * | 12/2015 | Hari ....................... H02M 1/15 |
| | | | 323/271 |
| 2017/0093383 | A1 * | 3/2017 | Friend ..................... H03K 5/02 |
| 2017/0141781 | A1 | 5/2017 | Friend et al. |
| 2017/0159344 | A1 * | 6/2017 | Langenberg .......... E05F 15/611 |

OTHER PUBLICATIONS

International Search Report and Written Opinion for International Application No. PCT/IB2018/058811, dated Feb. 28, 2019.

\* cited by examiner

EFFICIENT DIFFERENTIAL CHARGE PUMP WITH SENSE AND COMMON MODE CONTROL

BACKGROUND

The present disclosure generally relates to a differential charge pump for use in an electronic circuit, such as a phase-locked loop (PLL) circuit.

In a computer or other electronic system, clock signals are used to control and sequence the flow of data between sequential storage elements, such as registers or latches on an integrated circuit (IC). A clock circuit including a PLL can maintain precise phase relationships between a reference clock signal and a distributed clock signal that sequences digital logic or other circuit elements. Precise clock phase relationships may be useful in achieving known and efficient timing relationships between sequential logic elements.

A PLL circuit detects phase differences between a reference clock signal and a distributed clock signal, and generates control signals based on those phase differences. The control signals may be used to adjust the timing and/or frequency of a clock generation circuit such as a voltage-controlled oscillator (VCO), the output of which can be distributed to a plurality of logic or other circuit elements. Such a clock can be used in numerous elements in an integrated circuit, including a microprocessor, memory controller, graphics controller, and others.

SUMMARY

Embodiments described herein include circuits and systems relating to a differential charge pump. Embodiments include a differential charge pump circuit including a reference current, a sensing operational amplifier, a controlling operational amplifier, and an h-bridge circuit coupled to the reference current and the controlling operational amplifier. The reference current drives a first portion of the h-bridge circuit and the controlling operational amplifier controls a second portion of the h-bridge circuit. The h-bridge circuit includes a first node and a second node. The first and second node are inputs to the sensing operational amplifier, and the circuit is configured to control a voltage at the first node so that it is substantially equal to a voltage at the second node for a plurality of voltages at the second node.

Embodiments further include a system including a phase detector configured to generate a first output signal related to a difference in phase between a received reference signal and a received feedback signal, a filter circuit, and a variable frequency oscillator configured to generate a second output signal. The feedback signal received by the phase detector is based on the second output signal. The system further includes a differential charge pump circuit configured to generate a signal across the filter circuit that is based on the first output signal. The differential charge pump circuit includes a reference current, a sensing operational amplifier, a controlling operational amplifier, and an h-bridge circuit coupled to the reference current and the controlling operational amplifier. The reference current drives a first portion of the h-bridge circuit and the controlling operational amplifier controls a second portion of the h-bridge circuit. The h-bridge circuit includes a first node and a second node. The first and second nodes are inputs to the sensing operational amplifier. The circuit is configured to control a voltage at the first node so that it is substantially equal to a voltage at the second node for a plurality of voltages at the second node.

Embodiments further include a differential charge pump circuit including a sensing operational amplifier and an h-bridge circuit. The h-bridge circuit includes a first node and a second node. The first and second nodes are inputs to the sensing operational amplifier. The differential charge pump circuit is configured to control a voltage at the first node so that it is substantially equal to a voltage at the second node for a plurality of voltages at the second node. The h-bridge circuit further includes a first transistor coupled to the first node and the second node. The first transistor includes a gate coupled to an output of the sensing operational amplifier. The voltage at the first node is controlled by the sensing operational amplifier and the first transistor.

Embodiments further include a differential charge pump circuit including a first independent current source, a second independent current source, and an h-bridge circuit coupled to the first and second independent current sources. The first independent current source drives a first portion of the h-bridge circuit and the second independent current source drives a second portion of the h-bridge circuit.

Embodiments further include a phase-locked loop circuit including a phase detector configured to generate a first output signal related to a difference in phase between a received reference signal and a received feedback signal, a filter circuit, and a variable frequency oscillator configured to generate a second output signal. The feedback signal received by the phase detector is based on the second output signal. The phase-locked loop circuit further includes a differential charge pump circuit configured to generate a signal across the filter circuit that is based on the first output signal. The differential charge pump circuit includes a sensing operational amplifier and an h-bridge circuit. The h-bridge circuit includes a first node and a second node. The first and second nodes are inputs to the sensing operational amplifier. The differential charge pump circuit is configured to control a voltage at the first node so that it is substantially equal to a voltage at the second node for a plurality of voltages at the second node. The h-bridge circuit further includes a first transistor coupled to the first node and the second node. The first transistor includes a gate coupled to an output of the sensing operational amplifier. The voltage at the first node is controlled by the sensing operational amplifier and the first transistor.

DETAILED DESCRIPTION

A differential charge pump can be used in a PLL circuit. The differential charge pump can be used to help control the operation of a variable frequency oscillator based on a difference between a reference signal and a feedback signal in the PLL. Such a differential charge pump can include an h-bridge circuit, which drives current across alternate paths as part of the charge pump operation. But in certain circumstances, use of the h-bridge circuit to drive current across alternate paths can create a voltage disparity between alternate nodes on the alternate paths. This can increase charge sharing and jitter in the PLL circuit. To reduce this problem, the voltage at one of the nodes can be controlled to match the voltage at the alternate node, reducing the charge sharing and jitter and improving the operation of the differential charge pump and PLL.

Figure 1:
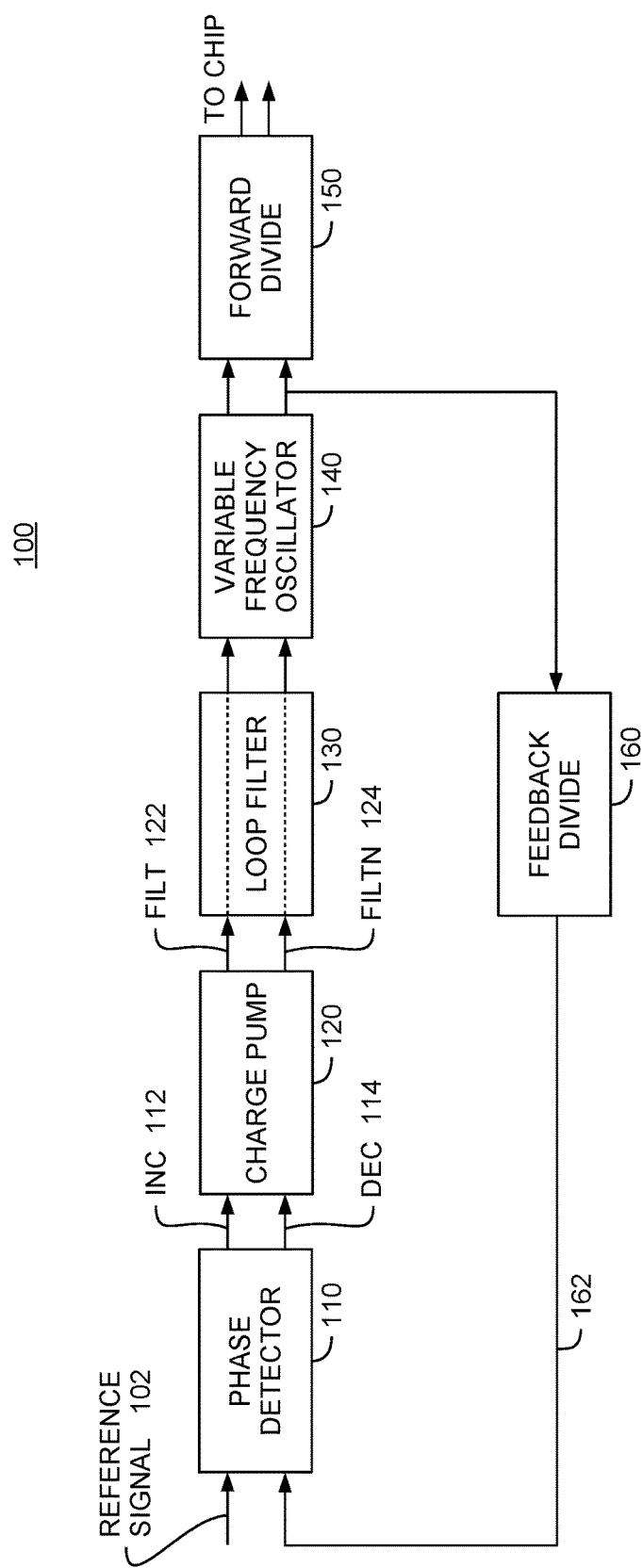
FIG. 1 illustrates an example PLL circuit, according to one embodiment described herein.

FIG. 1 is a block diagram illustrating a phase-locked loop (PLL) circuit. The PLL circuit 100 generally includes a phase detector 110, a charge pump 120, a loop filter 130, a variable frequency oscillator 140, a forward divide 150, and a feedback divide 160. The phase detector 110 may have any suitable implementation, such as an analog phase detector, a digital phase detector, and so forth. The phase detector 110 generally operates to produce a phase difference signal that represents a difference in phase between a reference signal 102 and a feedback signal 162. The feedback signal 162 is based on an output signal of the variable frequency oscillator 140.

The signal output by the phase detector 110 includes an increase signal (INC) 112 component outputted by the phase detector 110 on a first connection (such as a conductive wire or trace) with the charge pump 120, and a decrease signal (DEC) 114 component outputted on a second connection with the charge pump 120. In some cases, the INC 112 and DEC 114 signals may be pulses having widths based on the determined phase difference. For example, if the feedback signal 162 has a higher frequency than the reference signal 102, the phase detector 110 produces a pulse on the DEC 114 (e.g., drive the line "high" for a period) while holding the INC 112 at a fixed voltage (e.g., ground or other logical "low" voltage).

The pulses of the DEC 114 signal affects the operation of the charge pump 120, which will in turn reduce the frequency of the variable frequency oscillator 140, reducing the output frequency toward the frequency of reference signal 102. In other implementations of the phase detector 110, the pulses of the INC 112 and DEC 114 signals can be at least partly overlapping. For example, pulse(s) of the INC 112 signal may be contemporaneous with pulse(s) of the DEC 114 signal, but the pulse(s) of INC 112 signal have a shorter duration and/or may be fewer in number to reduce output frequency of the variable frequency oscillator 140.

The charge pump 120 receives the INC 112 and DEC 114 signals and outputs a signal across the loop filter 130, which can control the operation of the variable frequency oscillator 140. The signal output by the charge pump 120 includes a FILT component 122 and a FILTN component 124. In some embodiments, the FILTN component 124 represents a substantially inverted copy of the FILT component 122. The FILT and FILTN components can alternately be referred to as OUT and OUTN components. The charge pump 120 can be coupled to the loop filter 130 through any suitable component, such as a conductive wire or trace. In some embodiments, the charge pump 120 can be coupled to the variable frequency oscillator 140 through a continuous wire, and the loop filter 130 can branch off from the wire connecting the charge pump 120 to the variable frequency oscillator 140.

The loop filter 130 may include any number of elements selected to control dynamics of the control loop (here, PLL circuit 100). In some embodiments, the loop filter 130 is a low-pass filter comprising a capacitive element. In some embodiments, the loop filter may include proportional elements, high-pass filter elements, etc.

The variable frequency oscillator 140 produces an output signal based on the received signal from the loop filter 130. The variable frequency oscillator 140 may have any suitable implementation, such as a voltage-controlled oscillator (VCO), a numerically controlled oscillator (NCO), and so forth. In some embodiments, the output signal from variable frequency oscillator 140 is processed through a forward divide 150 and feedback divide 160. In other embodiments, the feedback signal 162 is the output signal from the variable frequency oscillator 140.

While the PLL circuit 100 is illustrated in FIG. 1, a person of ordinary skill in the art will recognize that the charge pump 120, and associated circuitry, is applicable to various other analog and/or digital control loop circuits. If the charge pump 120 is used as part of a PLL circuit, the PLL circuit can be located on an integrated circuit (IC) device. As discussed above, the PLL circuit can act as a clock for a microprocessor, memory controller, graphics controller, or any other suitable component. The PLL circuit can be located on the same IC as the device for which it is acting as a clock, it can be located on a different IC, or it can be distributed across multiple ICs.

Figure 2:
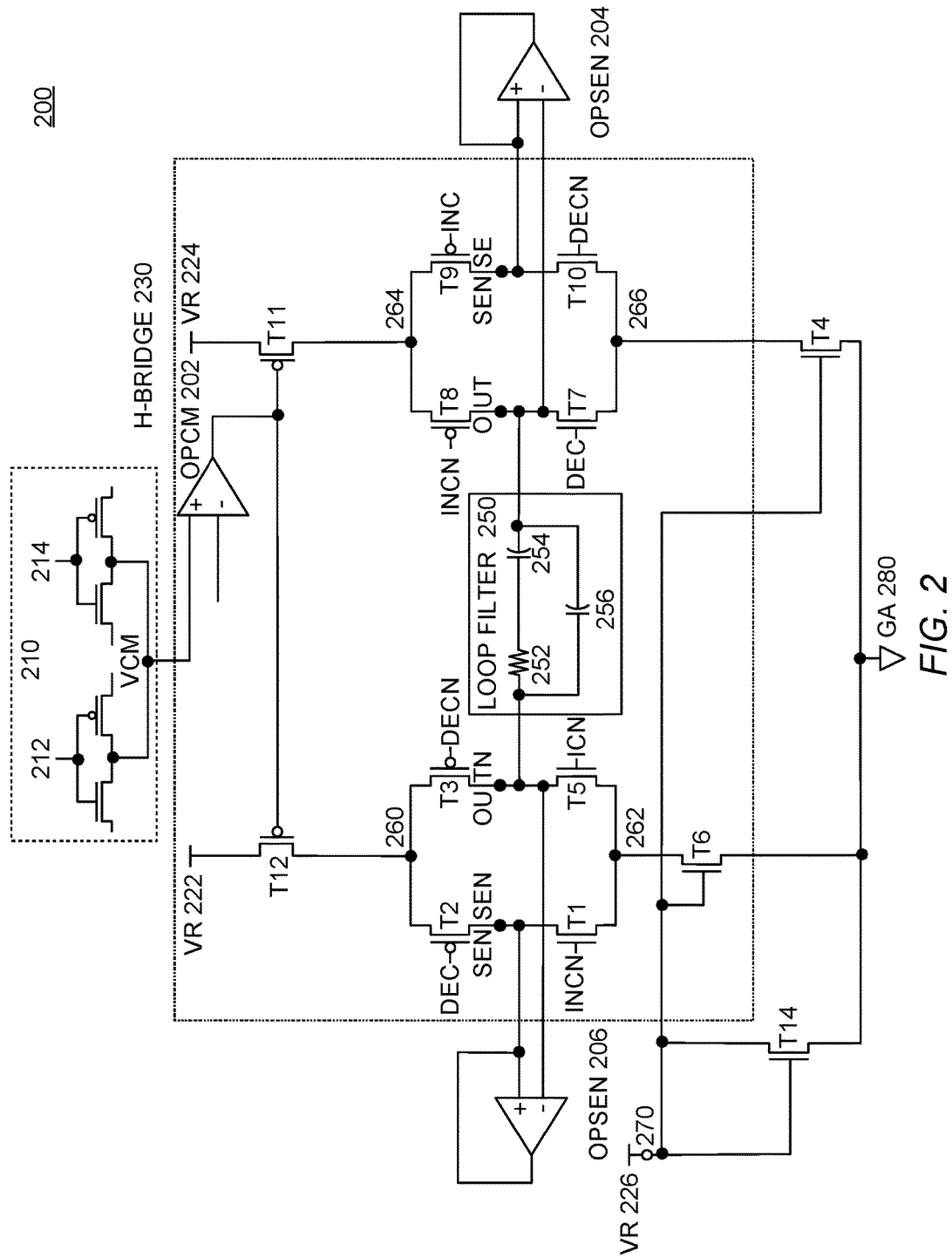
FIG. 2 illustrates a differential charge pump circuit, according to one embodiment described herein.

FIG. 2 illustrates an exemplary charge pump circuit 200. The charge pump 200 represents one possible configuration of the charge pump 120 described in FIG. 1. Nodes OUT and OUTN in the differential charge pump 200 can be used as control voltages for the variable frequency oscillator. For example, OUT can be equivalent to the signal FILT 122 in FIG. 1 and OUTN can be equivalent to the signal FILTN 124 in FIG. 1. In one embodiment, OUTN can be the inverse of OUT.

The differential charge pump 200 further includes h-bridge 230, which includes a number of transistors used to switch current into, and out of, the loop filter 250 to control the frequency of the variable frequency oscillator. These transistors are illustrated and described as p-channel metal-oxide-semiconductor field-effect transistors (PFET) and n-channel metal-oxide-semiconductor field-effect transistors (NFET), respectively, but any suitable type of transistor or switching device may be used.

The differential charge pump 200 can further include nodes SENSE and SENSEN, where SENSEN is the inverse of SENSE. In order to minimize charge sharing, and therefore noise and jitter, in the circuit, a pair of sense operational amplifiers (op-amps), OPSEN 204 and OPSENN 206 can be used force the SENSE and SENSEN nodes to the same voltages as the OUT and OUTN nodes. An example circuit relating to the amplifiers OPSEN 204 and OPSENN 206 is discussed in more detail with regard to FIG. 3.

Biasing the SENSE and SENSEN nodes to match the voltages at the OUT and OUTN nodes decreases the noise on the OUT and OUTN nodes as the transistors in the h-bridge operate. In further embodiments, the charge pump 200 can include many h-bridge devices in parallel with the SENSE/SENSEN and OUT/OUTN nodes to get varying amounts of charge pump current. The total OUT/OUTN and SENSE/SENSEN current can vary based on implementation and other factors, but in some embodiments the current ranges from 0.4 to 0.8 mA.

Describing FIG. 2 in more detail, a circuit 210 includes four transistors. These transistors average the input signals 212 and 214 to generate a common mode voltage source VCM. While not depicted in the figures, in an embodiment, input signal 212 can be coupled to the OUTN node, and input signal 214 can be coupled to the OUT node. Further, the NFET transistors in circuit 210 can be coupled to a voltage source and the PFET transistors can be coupled to ground. The common mode voltage source VCM is coupled to the input of an amplifier OPCM 202. The output of amplifier OPCM 202 is applied to the gates of the transistors T11 and T12. Voltage sources VR 222 and VR 224 are coupled to the transistors T11 and T12, respectively. Elements labeled VR in the drawings and written description are voltage sources, sometimes abbreviated as VDD. Elements labeled GA in the figures and written description are grounds, sometimes abbreviated as GND. The h-bridge 230 operates to steer current based, for example, on feedback from the phase detector 110 discussed with regard to FIG. 1.

Starting on the right side of FIG. 1, the transistor T11 is coupled to the transistors T9 and T8. The transistor T9 is coupled to the SENSE node. The transistor T8 is coupled to the OUT node. The transistors T10 and T7 are coupled to the transistor T4. The INC signal is applied to the gate of the transistor T9. The INCN signal is applied to the gate of the transistor T8. The DEC signal is applied to the gate of the transistor T7. The DECN signal is applied to the gate of the transistor T10. The INC and DEC signals can be, for example, the signals discussed with reference to FIG. 1. In an embodiment, the INCN signal can be the inverse of the INC signal, and the DECN signal can be the inverse of the DEC signal. Although not illustrated in the figures, inverters may be included to produce the INCN signal from the INC signal and the DECN signal from the DEC signal.

When the circuit is operating, current flows from node 260 to node 262 and from node 264 to node 266. The path through the h-bridge 230 is selected based on the INC and DEC signals. For example, in a PLL circuit like the PLL circuit 100 illustrated in FIG. 1, assume that the reference signal 102 matches the feedback signal 162. This means that the frequency of the variable frequency oscillator 140 can remain unchanged. Because the phase detector 110 does not need to change the voltage across the loop filter 130, the INC 112 and DEC 114 signals can be held at a logical low ("0") while the inverses, INCN and DECN will be high ("1").

In the circuit illustrated in FIG. 2, the PFET transistor T9 will conduct (because the value of INC at the gate of PFET transistor T9 is low), while the PFET transistor T8 will not conduct (because the value of INCN at the gate of PFET transistor T8 is high). Similarly, the NFET transistor T10 will conduct (because the value of DECN is high), while the NFET transistor T7 will not conduct (because the value of DEC is low). In this scenario, the transistors T2 and T1 along the left side of the h-bridge 230 will also conduct, while the transistors T3 and T5 will not.

When the reference signal to the PLL (e.g., reference signal 102) differs from the feedback signal (e.g., feedback signal 162), the PLL will change the voltage across the loop filter 130 to bring the signals together. For example, assume that the frequency of the feedback signal 162 in FIG. 1 is less than the frequency of the reference signal 102. The PLL circuit increases the frequency of the variable frequency oscillator 140 to compensate. In this scenario, the phase detector 110 sends a logical high INC signal to the charge pump 120 and a logical low DEC signal.

Returning to FIG. 2, this means that INC is high, INCN is low, DEC is low, and DECN is high. Thus PFET transistor T8 conducts (because INCN is low), while NFET transistor T7 does not (because DEC is also low). This increases the voltage at the OUT node. On the left side of the h-bridge, PFET transistor T3 does not conduct (because DECN is high) while NFET transistor T5 does conduct (INC is also high). This decreases the voltage at the OUTN node. This change in the voltage difference between OUT and OUTN changes the frequency of the variable frequency oscillator via loop filter 250.

However, this switching by the h-bridge can create a voltage difference between the SENSE and OUT nodes and SENSEN and OUTN nodes which can cause undesirable charge sharing between the nodes and jitter in the circuit. To alleviate this, the voltage level at the SENSE node can be biased to match the voltage level at the OUT node, and the voltage level at the SENSEN node can be biased to match the voltage level at the OUTN node. One way to achieve this is through the use of sense amplifiers OPSEN 204 and OPSENN 206. The sense amplifiers OPSEN 204 and OPSENN 206 bias the SENSE and SENSEN nodes so that the voltages track the OUT and OUTN nodes. This alleviates voltage differences when switching paths on the h-bridge and mitigates charge sharing and jitter.

The OUT node is coupled to the loop filter 250. The loop filter 250 includes two capacitors, 254 and 256, and a resistor 252. Moving to the left side of FIG. 2, the configuration is similar to the right side discussed above. The transistor T12 is coupled to the transistors T2 and T3. The transistor T2 is coupled to the SENSEN node. The transistor T3 is coupled to the OUTN node. The transistors T1 and T5 are coupled to the transistor T6. The INC signal is applied to the gate of the transistor T5. The INCN signal is applied to the gate of the transistor T1. The DEC signal is applied to the gate of the transistor T2. The DECN signal is applied to the gate of the transistor. The INC and DEC signals can be, for example, the signals discussed with reference to FIG. 1. In an embodiment, the INCN signal can be the inverse of the INC signal, and the DECN signal can be the inverse of the DEC signal.

As discussed above, the h-bridge circuit can operate to switch paths across transistors T1, T2, T3, and T5, depending on the values of INC, INCN, DEC, and DECN. The sense amplifier OPSENN 206 can be used to bias the SENSEN node so that the voltage matches the voltage at the OUTN node. Moving toward the bottom of FIG. 2, a reference current 270 and voltage source VR 226 are applied to the gates of transistors T14, T6, and T4. Reference current 270 can act as a power supply. Transistors T14 and T4 are coupled to ground GA 280.

Figure 3:
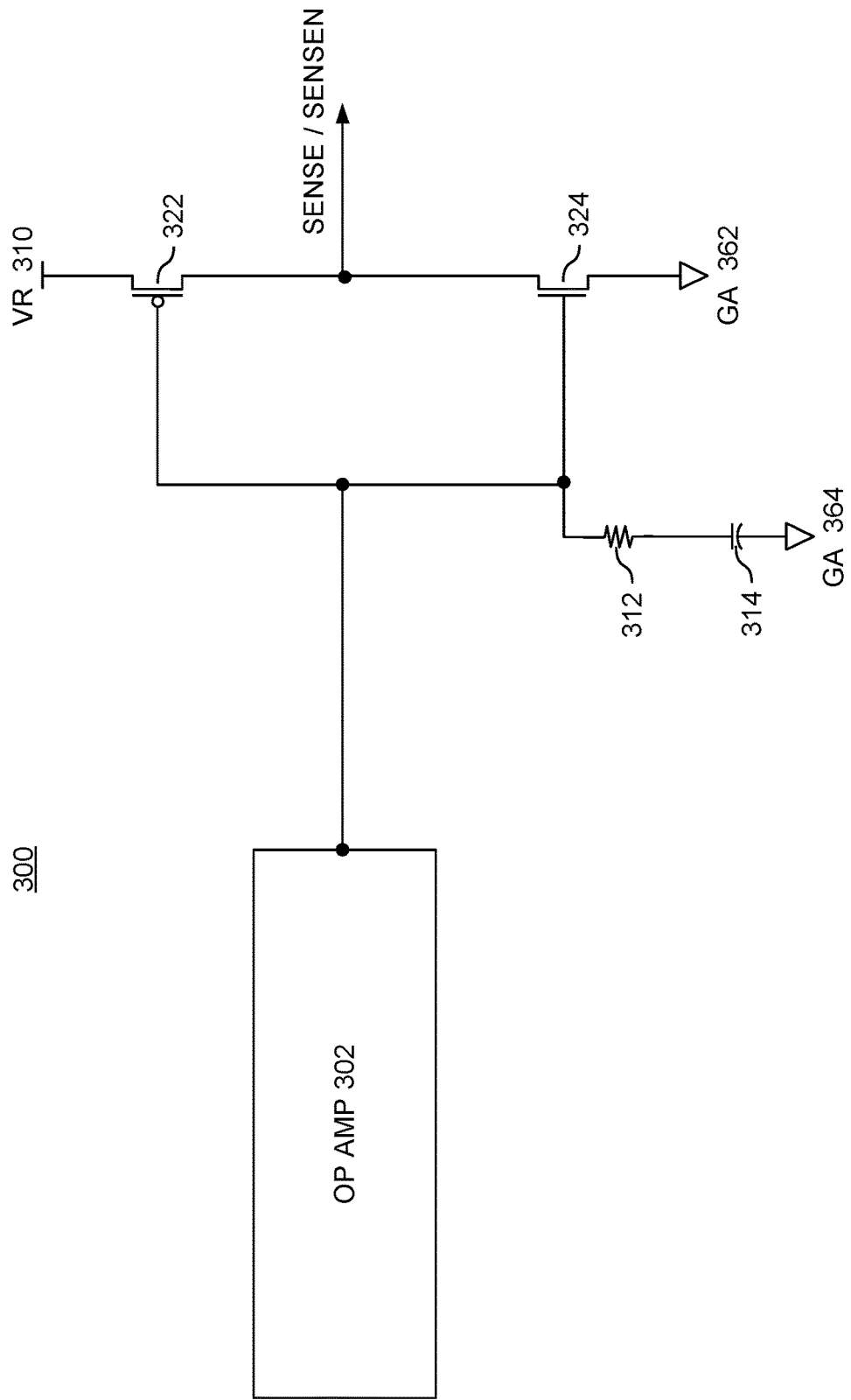
FIG. 3 illustrates a sense amplifier circuit, according to one embodiment described herein.

FIG. 3 illustrates a sense amplifier circuit 300, consistent with the embodiment described in FIG. 2. As discussed with regard to FIG. 2, the circuit illustrated in FIG. 3 can be used to bias the SENSE and SENSEN nodes of differential charge pump 200 to match the voltage of the OUT and OUTN nodes. This decreases charge sharing and noise. The amplifier circuit 300 includes op-amp 302, which can be any suitable operational amplifier. For example, op-amp 302 can be a wide input common mode range op-amp.

The amplifier circuit 300 further includes a voltage source VR 310, the transistors 322 and 324, a ground 362, a resistor 312, a capacitor 314, and another ground 364. Transistors 322 and 324 can be representative of transistors in the differential charge pump 200 of FIG. 2. As one example, transistor 322 could be transistor T2 in differential charge pump 200 and transistor 324 could be transistor T1. Alternatively, transistor 322 could be transistor T9 and transistor 324 could be transistor T4. These are merely examples, and other transistor configurations are also possible.

While differential charge pump 200 and amplifier circuit 300 work well functionally to reduce noise and jitter, the design has some drawbacks. Because the voltage in the OUT/OUTN nodes can range from 0 to the voltage source (e.g., 0 to 1.2 V), transistors 322 and 324 are relatively large in order to bias the SENSE and SENSEN nodes to match the voltage of the OUT and OUTN nodes. But in certain circumstances, for example when the voltage at the OUT and OUTN nodes is approximately ½ of the voltage source (e.g., 0.6 V), a relatively high current runs between voltage source VR 310 and ground GA 362. This bias current can be referred to as a shoot-through current, and it can flow between transistor 322 and 324. The circuit dissipates this current, creating problems with self-heating and elecromigration, and making it difficult to meet self-heating and electromigration requirements. Further, the relatively large size of transistors 322 and 324 increases the gain of the circuit and makes it more difficult to create a stable feedback loop.

Figure 4:
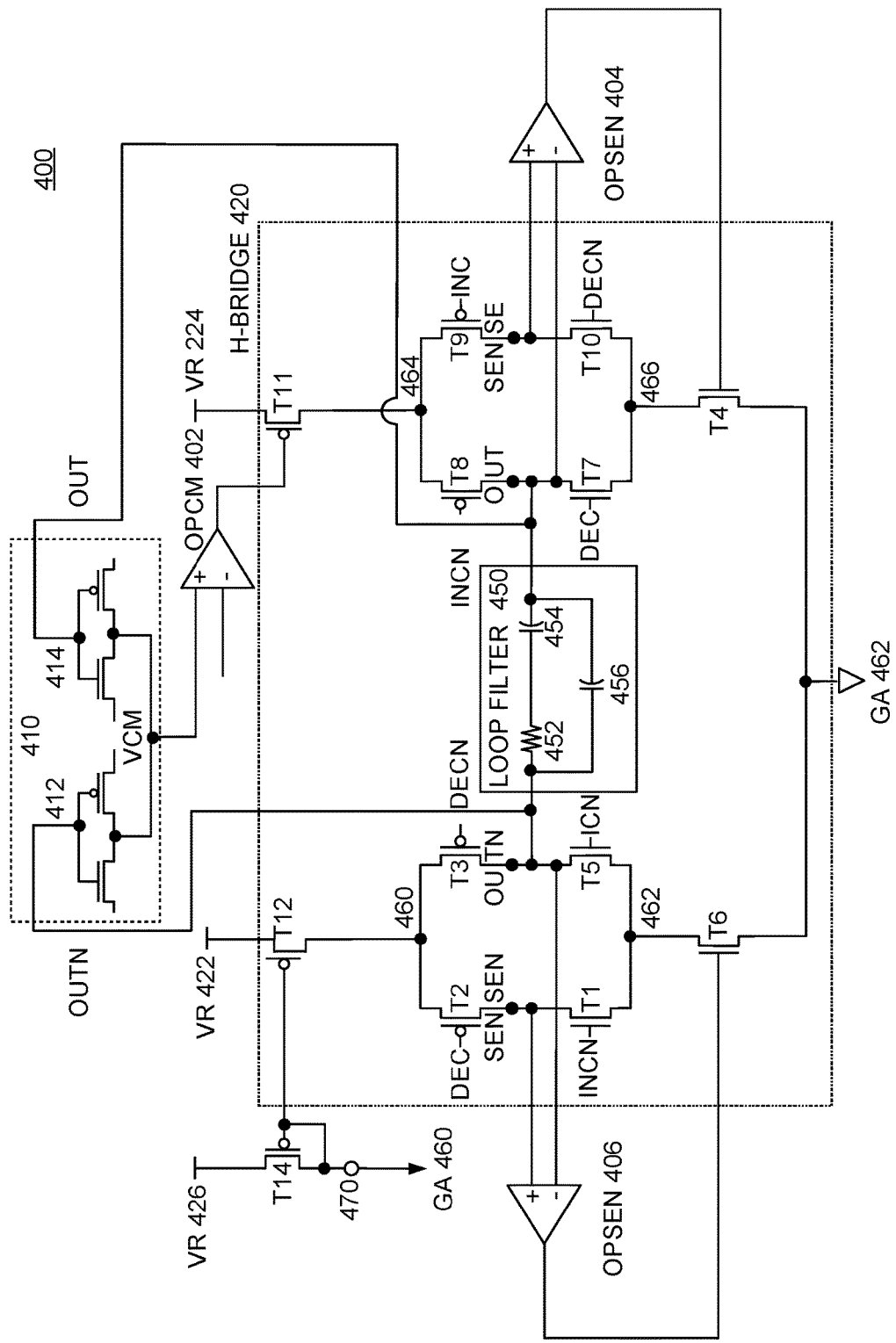
FIG. 4 illustrates another differential charge pump circuit, according to one embodiment described herein.

FIG. 4 illustrates a further differential charge pump circuit 400. The design of the differential charge pump 400 maintains the functional advantages of the circuit 200 illustrated in FIG. 2, while lessening some of the disadvantages discussed above. A charge pump reference current 470 drives ¼ of the current in the h-bridge 420 with the transistor T12. The common mode control op-amp OPCM 402 drives an additional ¼ of the current in the h-bridge 420 with the transistor T11. The sense amplifiers OPSEN 404 and OPSENN 406 then drive the remaining portions of the h-bridge 420.

In differential charge pump 400, amplifiers OPSEN 404 and OPSENN 406 do not need to directly bias the SENSE and SENSEN nodes to match the voltage of the OUT and OUTN nodes. Instead, the voltage at the SENSEN node is controlled to match the voltage at the OUTN node through the amplifier OPSENN 406 driving the gate of transistor T6. As discussed above, the charge pump reference current 470 is connected to the left side of the h-bridge 420. As the PLL operates, the current at both the transistor T12 and the transistor T6 approaches the charge pump reference current 470. The amplifier OPSENN 406 uses the reference current to control the voltage at SENSEN, by driving the gate of transistor T6. This forces the SENSEN node to match the OUTN node. To force the SENSE node to match the OUT node, the amplifier OPSEN 404 drives the gate of transistor T4. This uses the current from amplifier OPCM 402, which drives the right side of the h-bridge 420, to match the voltages at the SENSE and OUT nodes.

In some circumstances the current from OPCM 402 may not match the charge pump reference current 470, and so the current on the left side of the h-bridge may not match the current on the right side of the h-bridge. But the operation of the PLL circuit forces the OPCM 402 to match the current from the charge pump reference 470. If the current on the right side of the h-bridge does not match the current on the left side of the h-bridge, the PLL may not be able to achieve lock because the voltage at OUT does not match the voltage at OUTN. As the PLL circuit operates, it shifts the common mode control amplifier OPCM 402 to drive the same current on the right side of the h-bridge as the left side, so that the voltages at OUT and OUTN match and the PLL can achieve lock.

In this embodiment, the amplifiers OPSEN 404 and OPSENN 406 do not directly bias the SENSE and SENSEN nodes, but instead only drive the gates of the transistors T4 and T6. As a result, the output of amplifiers OPSEN 404 and OPSENN 406 can be lower than in the design of differential charge pump 200. Further, the transistors T2, T1, T9, and T10 can be smaller than in the design of differential charge pump 200, and the excess current between transistors is greatly reduced. This reduces the self-heating and electromigration concerns in the design of differential charge pump 200, as discussed above with regard to FIG. 3, while maintaining the functional advantages.

Turning to the details of FIG. 4, like differential charge pump 200 illustrated in FIG. 2 differential charge pump 400 includes a circuit 410 with four transistors. These transistors average the input signals 412 and 414 to generate a common mode voltage source VCM. In an embodiment, input signal 412 can be coupled to the OUTN node, and input signal 414 can be coupled to the OUT node. Further, the NFET transistors in circuit 410 can be coupled to a voltage source and the PFET transistors can be coupled to ground. The common mode voltage source VCM is coupled to the input of an amplifier OPCM 402. But unlike differential charge pump 200, in differential charge pump 400 the voltage source VR 422 is coupled only to the left side of the h-bridge 420, through the transistor T12. On the right side of the h-bridge 420, the output of amplifier OPCM 402 is applied to the gate of the transistor T11. In this configuration, reference current 470 drives ¼ of the current in the h-bridge 420, while amplifier OPCM 402 drives another ¼ of the current in the h-bridge 420.

Moving down FIG. 4, in differential charge pump 400 the transistor T11 is coupled to transistors T9 and T8. The transistor T9 is coupled to the SENSE node. The transistor T8 is coupled to the OUT node. The transistors T10 and T7 are coupled to the transistor T4. The INC signal is applied to the gate of the transistor T9. The INCN signal is applied to the gate of the transistor T8. The DEC signal is applied to the gate of the transistor T7. The DECN signal is applied to the gate of the transistor T10. The INC and DEC signals can be, for example, the signals discussed with reference to FIG. 1. In an embodiment, the INCN signal can be the inverse of the INC signal, and the DECN signal can be the inverse of the DEC signal.

In one embodiment, the h-bridge operates to switch current between alternate paths and control a variable frequency oscillator, based on the INC, INCN, DEC, and DECN signals, in the same way as the h-bridge illustrated in FIG. 2 with respect to differential charge pump 200. Because the switching operation of the h-pump in the charge pump 400 is the same as the switching operation in the charge pump 200, the details will not be repeated.

The OUT node is coupled to an input of the sense amplifier OPSEN 404. The SENSE node is coupled to another input of the amplifier OPSEN 404. But in differential charge pump 400, the output of amplifier OPSEN 404 does not feed back to the SENSE node. Instead, the output of amplifier OPSEN 404 is applied to the gate of transistor T4. The amplifier OPSEN 404 is not required to directly bias the SENSE node to match the voltage of the OUT node, and so the output of amplifier OPSEN 404 does not need to be coupled to the SENSE node. This allows transistors, for example transistors T9 and T10, to be smaller in differential charge pump 400 than in differential charge pump 200, reducing the impedance and reducing the excess current flow. The amplifier OPSEN 404 controls the voltage of the SENSE node through driving the gate of transistor T4.

Like in differential charge pump 200, the OUT node in differential charge pump 400 is coupled to the loop filter 450. The loop filter 450 includes two capacitors, 454 and 456, and a resistor 452. Moving to the left side of FIG. 4, the transistor T12 is coupled to the transistors T2 and T3. The transistor T2 is coupled to the SENSEN node. The transistor T3 is coupled to the OUTN node. The transistors T1 and T5 are coupled to the transistor T6. The INC signal is applied to the gate of the transistor T5. The INCN signal is applied to the gate of the transistor T1. The DEC signal is applied to the gate of the transistor T2. The DECN signal is applied to the gate of the transistor T3. The INC and DEC signals can be, for example, the signals discussed with reference to FIG. 1. In one embodiment, the INCN signal can be the inverse of the INC signal, and the DECN signal can be the inverse of the DEC signal.

Like the right side of the h-bridge, the OUTN node on the left side is coupled to an input of the amplifier OPSENN 406. The SENSEN node is coupled to another input of the amplifier OPSENN 406. The output of amplifier OPSENN 406 does not feed back to the SENSEN node. Instead, the output of amplifier OPSENN 406 is applied to the gate of transistor T6. The amplifier OPSENN 406 is not required to bias the SENSEN node to match the voltage of the OUTN node, and so the output of amplifier OPSENN 406 does not need to be coupled to the SENSEN node. This allows transistors, for example transistors T2 and T1, to be smaller in differential charge pump 400 than in differential charge pump 200, reducing the impedance and reducing the excess current flow. The amplifier OPSENN 406 controls the voltage of the SENSE node through driving the gate of transistor T4.

Figure 5:
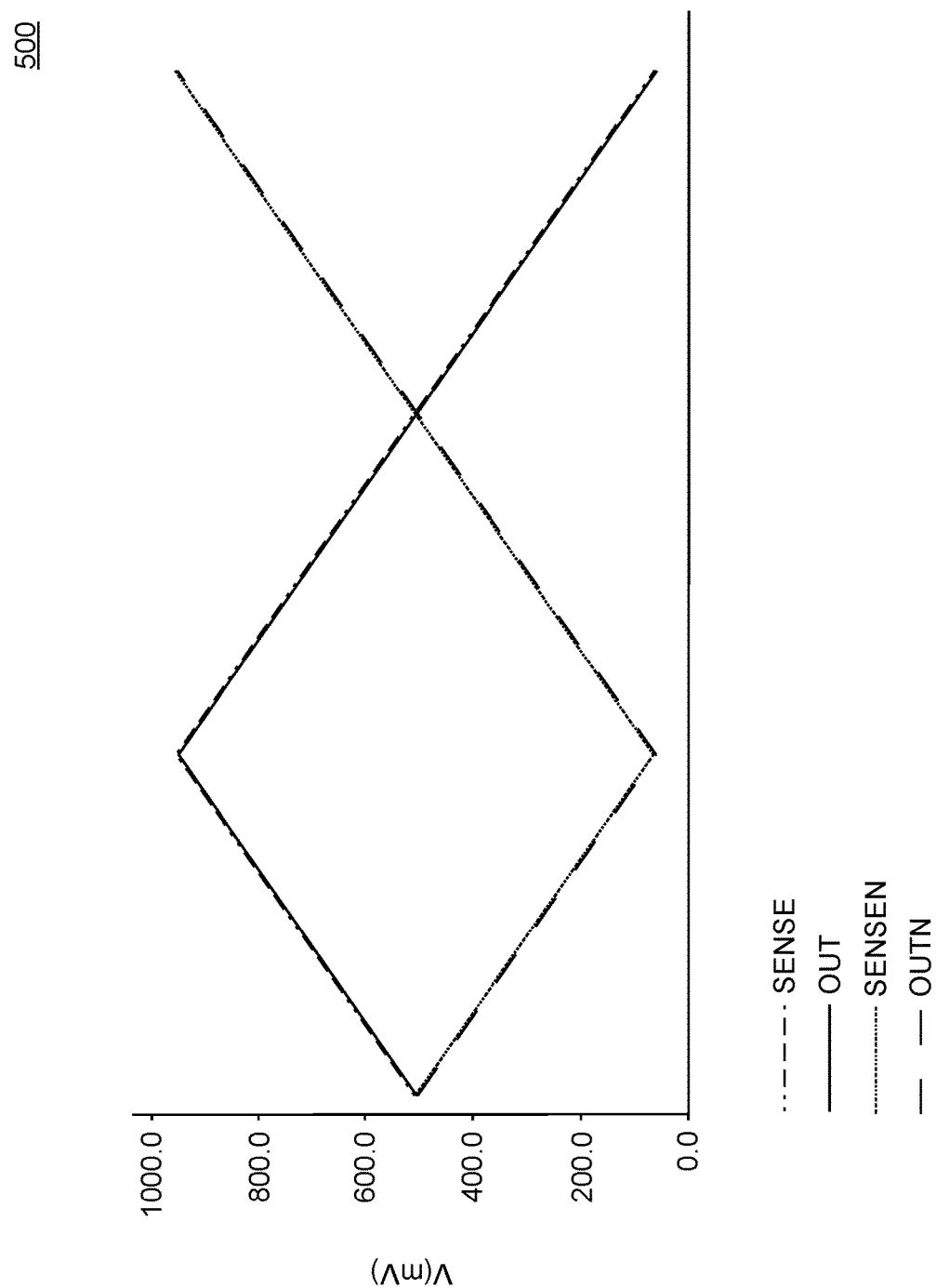
FIG. 5 illustrates example voltage levels at different nodes in the differential charge pump circuit of FIG. 4, according to one embodiment described herein.

FIG. 5 is a chart illustrating the voltage at the SENSE, SENSEN, OUT, and OUTN nodes in the differential charge pump 400 of FIG. 4. As discussed above, the differential charge pump 400 is able to match the voltage of the SENSE node with the OUT node, and the SENSEN node with the OUTN node, without using amplifiers OPSEN 404 and OPSENN 406 to directly bias the voltage at the SENSE and SENSEN nodes. The result of this can be seen in FIG. 5, which shows the voltage at the SENSE node nearly matching the voltage at the OUT node, and the voltage at the SENSEN node nearly matching the voltage at the OUTN node, for a variety of different voltages of the OUT and OUTN nodes.

Figure 6:
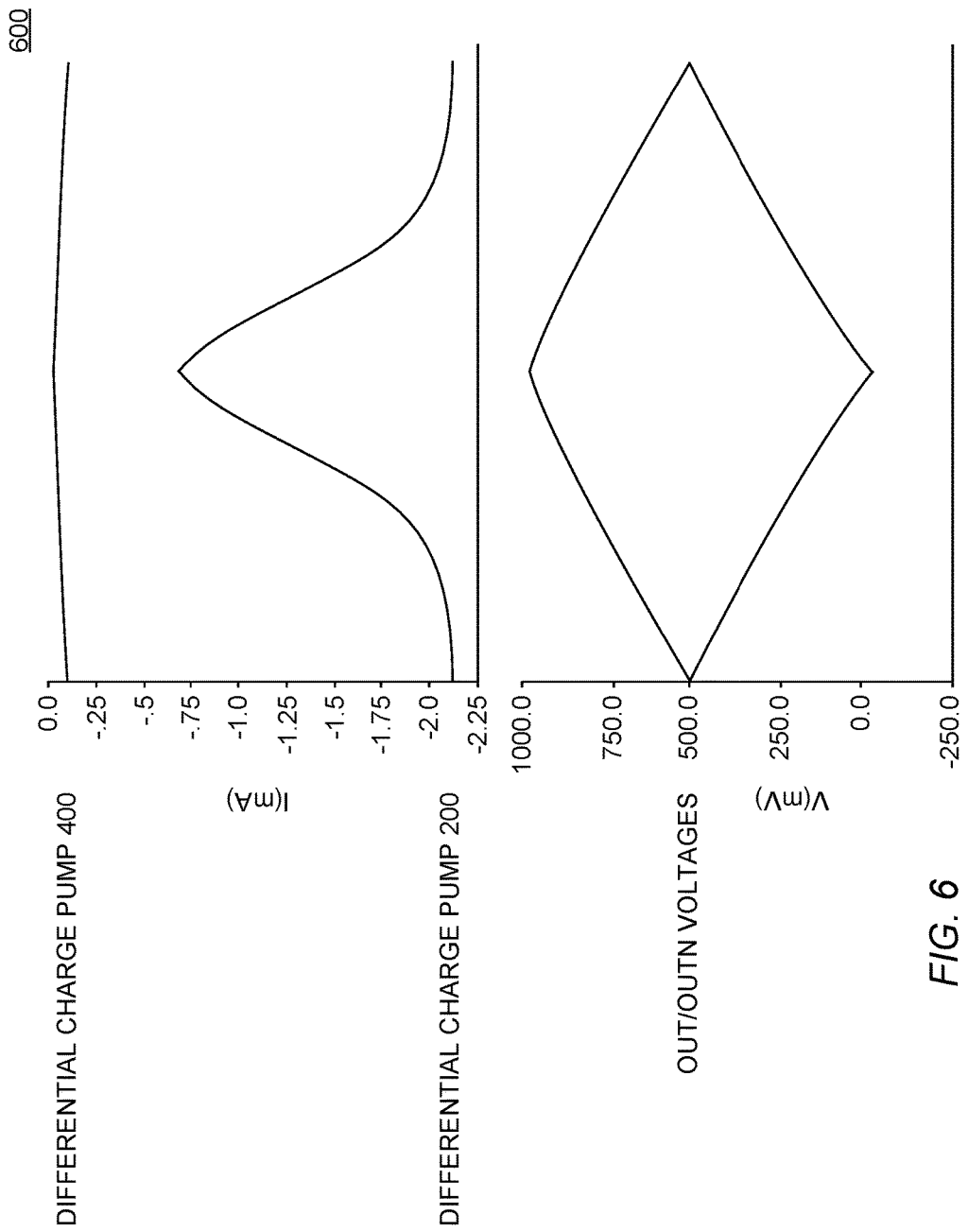
FIG. 6 illustrates example current between transistors in the differential charge pump circuits of FIGS. 2 and 4, according to one embodiment described herein.

FIG. 6 is a chart illustrating the current flow across comparable pairs of transistors in the differential charge pump 200 illustrated in FIG. 2 and the differential charge pump 400 illustrated in FIG. 4 for a variety of voltage levels for the OUT and OUTN nodes. For example, the illustration of FIG. 6 could apply to the current flow between transistors T1 and T2, or T10 and T9.

FIG. 6 illustrates that the current flow is dramatically reduced. For example, when the voltage across the OUT and OUTN nodes is 500 mV each, the current flow between the transistors in differential charge pump 200 is more than 2 mA, while the current flow between a comparable pair of transistors in differential charge pump 400 is less than 0.01 mA. As another example, when the OUT voltage is 750 mV and the OUTN voltage is 250 my, the current flow between transistors in the differential charge pump 200 is approximately 2 mA, while the current flow between the comparable transistors in differential charge pump 400 is approximately 0.005 mA.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

In the preceding, reference is made to embodiments presented in this disclosure. However, the scope of the present disclosure is not limited to specific described embodiments. Instead, any combination of the features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the preceding aspects, features, embodiments and advantages are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

The flowchart block diagrams in the Figures illustrate the architecture, functionality, and operation of possible implementations of systems and apparatuses according to various embodiments of the present invention. In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved.

While the foregoing is directed to embodiments of the present invention, other and further embodiments of the invention may be devised without departing from the basic scope thereof, and the scope thereof is determined by the claims that follow.

What is claimed is:

1. A differential charge pump circuit, comprising:
   a reference current;
   a first sensing operational amplifier;
   a controlling operational amplifier; and
   an h-bridge circuit coupled to the reference current and the controlling operational amplifier, wherein the reference current drives a first portion of the h-bridge circuit and the controlling operational amplifier controls a second portion of the h-bridge circuit, the h-bridge circuit comprising:
      a first node; and
      a second node, wherein the first and second node are inputs to the first sensing operational amplifier, and wherein the circuit is configured to control a voltage at the first node using the first sensing operational amplifier and a first transistor coupled to the first sensing operational amplifier, so that the voltage at the first node is substantially equal to a voltage at the second node for a plurality of voltages at the second node.

2. The differential charge pump circuit of claim 1, wherein:
   the first transistor comprises a gate coupled to an output of the first sensing operational amplifier.

3. The differential charge pump circuit of claim 1, the h-bridge circuit further comprising:
   a second sensing operational amplifier;
   a first inverse node, wherein the voltage at the first inverse node is the inverse of the voltage at the first node; and a second inverse node, wherein the voltage at the second inverse node is the inverse of the voltage at the second node, wherein the first inverse node and the second inverse node are inputs to the second sensing operational amplifier, and wherein the differential charge pump circuit is configured to control a voltage at the first inverse node so that it is substantially equal to a voltage at the second inverse node for a plurality of voltages at the second inverse node.

4. The differential charge pump circuit of claim 3, further comprising:
a second transistor, the second transistor comprising a gate coupled to an output of the second sensing operational amplifier, wherein the voltage at the first inverse node is controlled by the second sensing operational amplifier and the second transistor.

5. The differential charge pump circuit of claim 1, wherein the first node and second node are each coupled to a respective input of the first sensing operational amplifier.

6. The differential charge pump circuit of claim 1, further comprising a second sensing operational amplifier, wherein the first sensing operational amplifier and the second sensing operational amplifier control a third portion of the h-bridge circuit.

7. The differential charge pump circuit of claim 1, further comprising a second sensing operational amplifier, wherein the first sensing operational amplifier is a sense amplifier, the second sensing operational amplifier is a sense amplifier, and the controlling operational amplifier is a common mode control amplifier.

8. The differential charge pump circuit of claim 1, wherein the differential charge pump is used in a phase-locked loop circuit and wherein the h-bridge circuit is used to control a variable frequency oscillator.

9. The differential charge pump circuit of claim 8, wherein the second node is coupled to a filter circuit as part of the phase-locked-loop circuit.

10. The differential charge pump circuit of claim 1, wherein the circuit is configured to control the controlling operational amplifier so that during at least a portion of the circuit's operation the current in the second portion of the h-bridge circuit is substantially equal to the current in the first portion of the h-bridge circuit.

11. A system, comprising:
a phase detector configured to generate a first output signal related to a difference in phase between a received reference signal and a received feedback signal;
a filter circuit;
a variable frequency oscillator configured to generate a second output signal, wherein the feedback signal received by the phase detector is based on the second output signal; and
a differential charge pump circuit configured to generate a signal across the filter circuit that is based on the first output signal, the differential charge pump circuit comprising:
a reference current;
a first sensing operational amplifier;
a controlling operational amplifier; and
an h-bridge circuit coupled to the reference current and the controlling operational amplifier, wherein the reference current drives a first portion of the h-bridge circuit and the controlling operational amplifier controls a second portion of the h-bridge circuit, the h-bridge circuit comprising:
a first node; and a second node, wherein the first and second node are inputs to the first sensing operational amplifier, and wherein the h-bridge circuit is configured to control a voltage at the first node using the first sensing operational amplifier and a first transistor coupled to the first sensing operational amplifier, so that the voltage at the first node is substantially equal to a voltage at the second node for a plurality of voltages at the second node.

12. The system of claim 11, wherein the first transistor comprises a gate coupled to an output of the first sensing operational amplifier.

13. The system of claim 11, the h-bridge circuit further comprising:
a second sensing operational amplifier;
a first inverse node, wherein the voltage at the first inverse node is the inverse of the voltage at the first node; and
a second inverse node, wherein the voltage at the second inverse node is the inverse of the voltage at the second node, wherein the first inverse node and the second inverse node are inputs to the second sensing operational amplifier, and wherein the differential charge pump circuit is configured to control a voltage at the first inverse node so that it is substantially equal to a voltage at the second inverse node for a plurality of voltages at the second inverse node.

14. The system of claim 13, the differential charge pump circuit further comprising:
a second transistor, the second transistor comprising a gate coupled to an output of the second sensing operational amplifier, wherein the voltage at the first inverse node is controlled by the second sensing operational amplifier and the second transistor.

15. The system of claim 11, wherein the first node and second node are each coupled to a respective input of the first sensing operational amplifier.

16. The system of claim 11, further comprising a second sensing operational amplifier, wherein the first sensing operational amplifier and the second sensing operational amplifier control a third portion of the h-bridge circuit.

17. The system of claim 11, further comprising a second sensing operational amplifier, wherein the first sensing operational amplifier is a sense amplifier, the second sensing operational amplifier is a sense amplifier, and the controlling operational amplifier is a common mode control amplifier.

18. The system of claim 11, wherein the h-bridge circuit is used to control the variable frequency oscillator.

19. The system of claim 18, wherein the second node is coupled to the filter circuit.

20. The system of claim 11, wherein the charge pump circuit is configured to control the controlling operational amplifier so that during at least a portion of the circuit's operation the current in the second portion of the h-bridge circuit is substantially equal to the current in the first portion of the h-bridge circuit.

21. A differential charge pump circuit, comprising:
a first sensing operational amplifier; and
an h-bridge circuit, comprising:
a first node;
a second node, wherein the first and second nodes are inputs to the first sensing operational amplifier, and wherein the differential charge pump circuit is configured to control a voltage at the first node; and
a first transistor coupled to the first node and the second node, the first transistor comprising a gate coupled to an output of the first sensing operational amplifier, wherein the voltage at the first node is controlled using the first sensing operational amplifier and the first transistor so that it the voltage at the first node is substantially equal to a voltage at the second node for a plurality of voltages at the second node.

22. The differential charge pump circuit of claim 21, the h-bridge circuit further comprising:
a second operational amplifier;
a first inverse node, wherein the voltage at the first inverse node is the inverse of the voltage at the first node;
a second inverse node, wherein the voltage at the second inverse node is the inverse of the voltage at the second node, wherein the first inverse node and the second inverse node are inputs to the second operational amplifier, and wherein the differential charge pump circuit is configured to control a voltage at the first inverse node so that it is substantially equal to a voltage at the second inverse node for a plurality of voltages at the second inverse node; and
a second transistor, the second transistor comprising a gate coupled to an output of the second operational amplifier, wherein the voltage at the first inverse node is controlled by the second operational amplifier and the second transistor.

23. A differential charge pump circuit, comprising:
a first independent current source;
a second independent current source;
a first sensing operational amplifier; and
an h-bridge circuit coupled to the first and second independent current sources, wherein the first independent current source drives a first portion of the h-bridge circuit and the second independent current source drives a second portion of the h-bridge circuit, the h-bridge circuit further comprising:
a first node;
a second node, wherein the first and second node are inputs to the first sensing operational amplifier, and wherein the circuit is configured to control a voltage at the first node using the first sensing operational amplifier and a first transistor coupled to the first sensing operational amplifier so that the voltage at the first node is substantially equal to a voltage at the second node for a plurality of voltages at the second node.

24. A phase-locked loop circuit, comprising:
a phase detector configured to generate a first output signal related to a difference in phase between a received reference signal and a received feedback signal;
a filter circuit;
a variable frequency oscillator configured to generate a second output signal, wherein the feedback signal received by the phase detector is based on the second output signal; and
a differential charge pump circuit configured to generate a signal across the filter circuit that is based on the first output signal, the differential charge pump circuit comprising:
a first sensing operational amplifier; and
an h-bridge circuit, comprising:
a first node;
a second node, wherein the first and second nodes are inputs to the first sensing operational amplifier, and wherein the differential charge pump circuit is configured to control a voltage at the first node; and
a first transistor coupled to the first node and the second node, the first transistor comprising a gate coupled to an output of the first sensing operational amplifier, wherein the voltage at the first node is controlled using the first sensing operational amplifier and the first transistor so that it the voltage at the first node is substantially equal to a voltage at the second node for a plurality of voltages at the second node.

* * * * *